US011293821B2

(12) United States Patent
Daamen et al.

(10) Patent No.: US 11,293,821 B2
(45) Date of Patent: Apr. 5, 2022

(54) PRESSURE SENSOR MODULE

(71) Applicant: Sciosense B.V., Ae Eindhoven (NL)

(72) Inventors: Roel Daamen, Herkenbosch (NL);
Kailash Vijayakumar, Eindhoven (NL); Hendrik Bouman, Nijmegen (NL); Remco Henricus Wilhelmus Pijnenburg, Ae Hoogeloon (NL); Twan Van Lippen, Xm Bladel (NL)

(73) Assignee: SCIOSENSE B.V., AE Eindhoven (NL)

( * ) Notice: Subject to any disclaimer, the term of this patent is extended or adjusted under 35 U.S.C. 154(b) by 53 days.

(21) Appl. No.: 16/316,079

(22) PCT Filed: Jul. 19, 2017

(86) PCT No.: PCT/EP2017/068243
§ 371 (c)(1),
(2) Date: Jan. 8, 2019

(87) PCT Pub. No.: WO2018/024484
PCT Pub. Date: Feb. 8, 2018

(65) Prior Publication Data
US 2021/0055177 A1 Feb. 25, 2021

(30) Foreign Application Priority Data
Aug. 3, 2016 (EP) ..................................... 16182611

(51) Int. Cl.
*G01L 9/00* (2006.01)
*B81C 1/00* (2006.01)
(52) U.S. Cl.
CPC ........ *G01L 9/0048* (2013.01); *B81C 1/00039* (2013.01); *B81B 2201/0264* (2013.01)
(58) Field of Classification Search
CPC ...... B81B 1/00–008; B81B 3/00–0097; B81B 5/00; B81B 7/00–04; B81B 2201/0264;
(Continued)

(56) References Cited

U.S. PATENT DOCUMENTS 8,241,931 B1  8/2012 Antoine et al.
10,407,300 B2  9/2019 Zheng
(Continued)

FOREIGN PATENT DOCUMENTS

CN  101142672 A  3/2008
CN  103712720 A  4/2014
(Continued)

OTHER PUBLICATIONS

European Patent Office, International Search Report for PCT/EP2017/068243, dated Jul. 19, 2017.

*Primary Examiner* — Jonathan Han
(74) *Attorney, Agent, or Firm* — Slater Matsil, LLP

(57) ABSTRACT

In an embodiment, a pressure sensor module includes a base electrode surrounding at least a part of a bottom electrode, an anchor arrangement on top of the base electrode including at least two electrically conductive walls that both surround at least the part of the bottom electrode and an electrically conductive layer that covers at least the bottom electrode and the anchor arrangement such that a cavity is formed between the bottom electrode, the anchor arrangement and the electrically conductive layer, wherein, on at least one side of the cavity, a proportionate area of the electrically conductive walls in a cross section extending from a surface of an inner wall of the anchor arrangement facing the cavity to a surface of an outermost wall of the anchor arrangement facing away from the cavity in a plane parallel to a plane of the bottom electrode is equal to or less than 10%.

18 Claims, 9 Drawing Sheets

(58) Field of Classification Search
CPC .... B81B 2203/00–06; B81B 2207/00–99; B81B 2201/00–13; G01L 9/0048; B81C 1/00039
See application file for complete search history.

(56) References Cited

U.S. PATENT DOCUMENTS

| | | | |
|---|---|---|---|
| 2009/0124035 A1 | 5/2009 | Rey et al. | |
| 2013/0328142 A1* | 12/2013 | Nackaerts | H01L 29/84 257/415 |
| 2014/0264660 A1 | 9/2014 | Rothberg et al. | |
| 2014/0338459 A1* | 11/2014 | Besling | G01L 13/025 73/718 |
| 2016/0023893 A1 | 1/2016 | Besling et al. | |
| 2016/0069850 A1* | 3/2016 | van der Avoort | G01N 29/036 73/24.01 |
| 2016/0340180 A1 | 11/2016 | Daamen et al. | |

FOREIGN PATENT DOCUMENTS

| | | |
|---|---|---|
| CN | 103900753 A | 7/2014 |
| CN | 104891418 A | 9/2015 |
| CN | 105092112 A | 11/2015 |
| CN | 105439077 A | 3/2016 |
| CN | 105486445 A | 4/2016 |
| EP | 2700928 | 2/2014 |
| EP | 2848908 A1 | 3/2015 |
| WO | 2014151525 A2 | 9/2014 |

\* cited by examiner

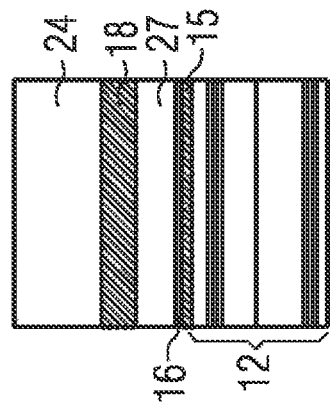
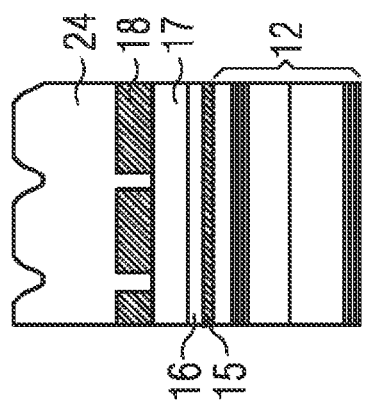
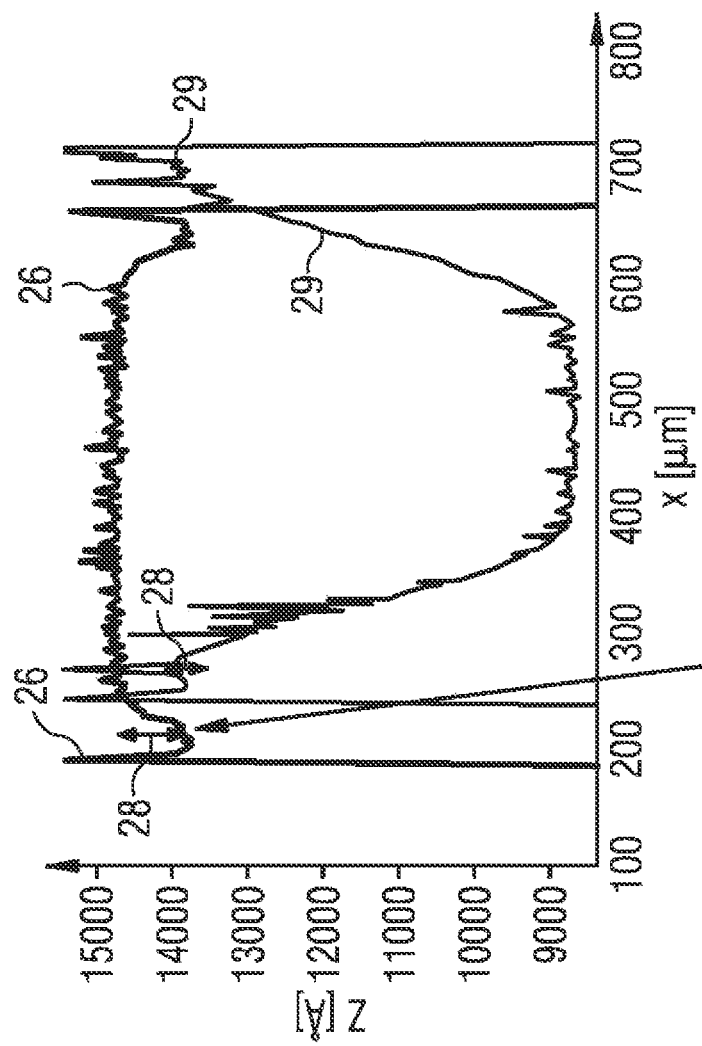
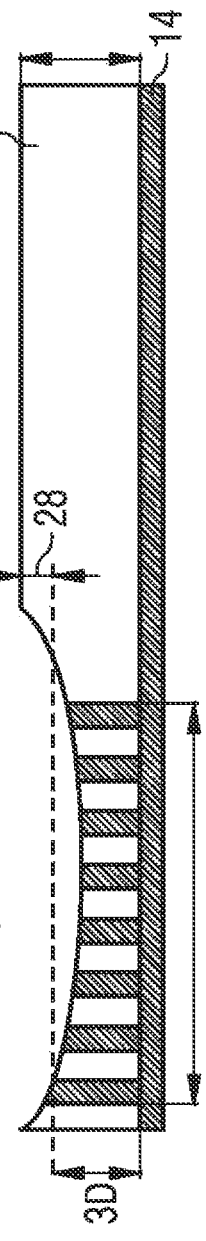

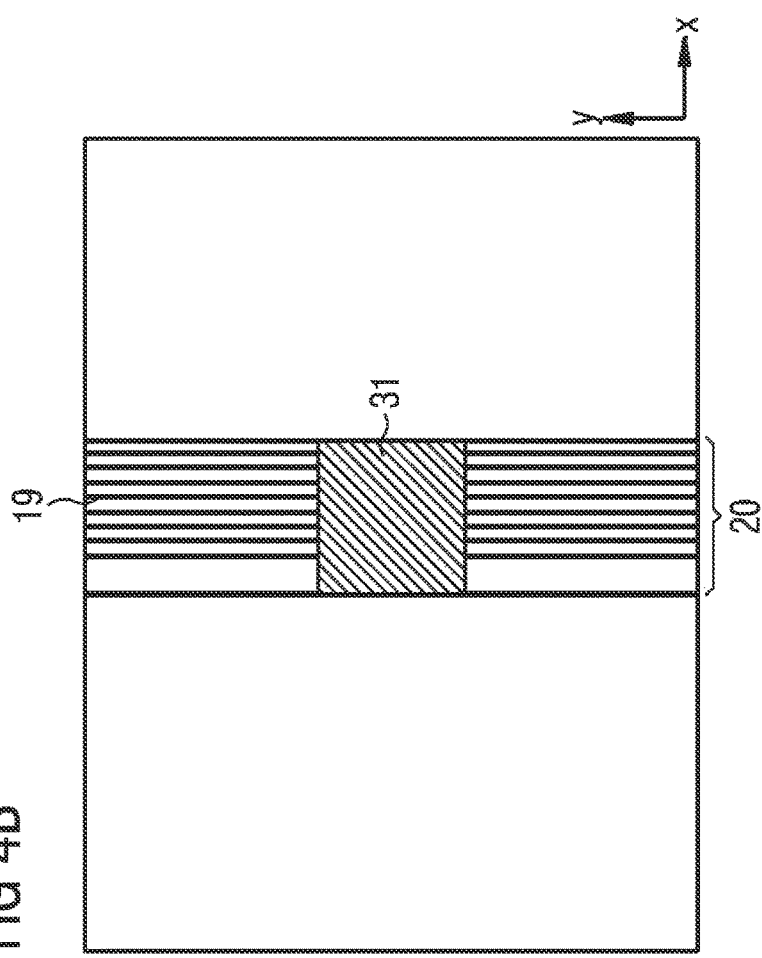
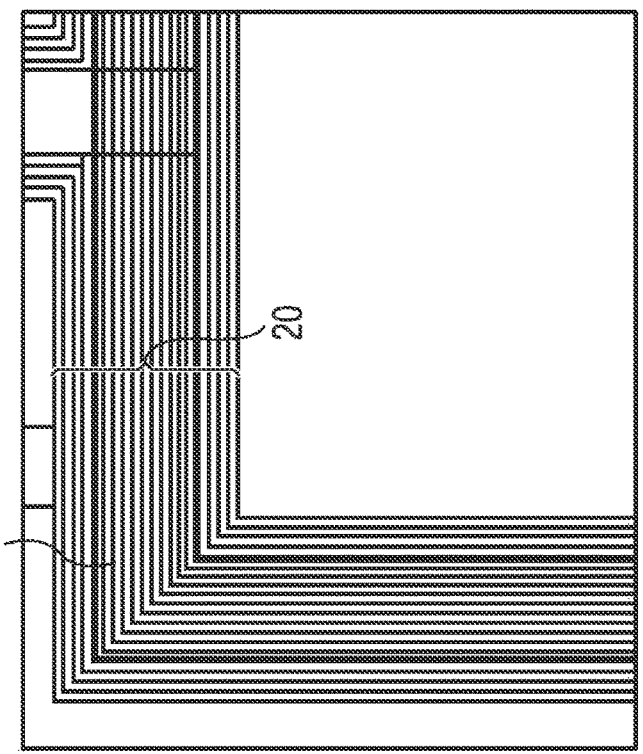

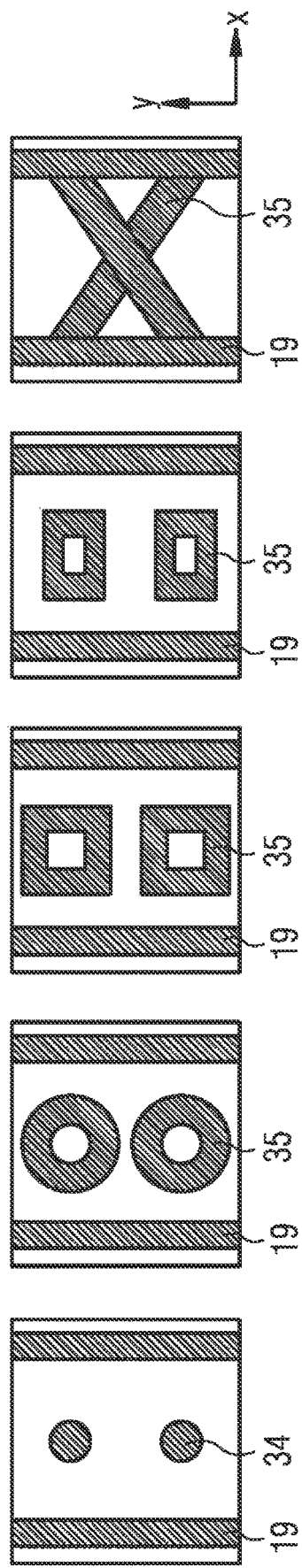

PRESSURE SENSOR MODULE

The present application relates to a pressure sensor module with an anchor arrangement and a method for forming a pressure sensor module.

BACKGROUND OF THE INVENTION

A capacitive pressure sensor can be monolithically integrated on top of a complementary metal oxide semiconductor device. For this, a cavity is formed between a bottom electrode and a top electrode where the top electrode acts as a suspended membrane. In order to hold the suspended membrane above the bottom electrode anchors can be employed. The anchors primarily act as a support for the suspended membrane. They also form an electrical connection from the underlying layers to the top electrode. If the cavity between the bottom electrode and the top electrode is created via etching, the anchors can also act as a lateral etch stop. Therefore, the anchors enable to etch a controlled volume, namely the cavity. Moreover, during the assembly of the pressure sensor module different processes such as taping, grinding and dicing are employed. During these processes the anchors are the highest point of the structure and take a majority of the force during the assembly process. Thus, the anchors need to be rigid.

A method for forming anchors involves patterning of a sacrificial layer such that trenches are formed. The material of the anchors is deposited on top of the trenches and the sacrificial layer such that the trenches are filled with the material of the anchors. In a next step the excess material on top of the sacrificial layer is removed by chemical mechanical polishing (CMP). This means, that if there is a large number of trenches in the region of the anchors the fraction of the material of the anchors is high in the region of the anchors. For example, the proportionate area of the material within the trenches in a lateral cross section through the anchor region can be higher than 30%, for example with 8 trenches of a width of 0.8 µm in an anchor region of 18 µm. If, for example, tungsten is used to fill the trenches erosion takes place in the anchor region induced by the CMP. This erosion leads to a reduced height of the anchors. Furthermore, a step or a difference in height is introduced between the anchor region and the remaining sacrificial layer.

Such a CMP-induced erosion in the anchor region leads to several problems for the pressure sensor module. Firstly, since the height of the structure is reduced in the anchor region the total height of the structure is estimated incorrectly. Consequently, the membrane sensitivity is not calculated correctly and hence the pressure sensor readings are inaccurate. Furthermore, the anchors do not have the same height and therefore additional stress is induced on some of the anchors. This leads to a reduced robustness of the structure. Moreover, an additional process variability is introduced due to the difference in height between the anchors and the remaining sacrificial layer.

SUMMARY OF THE INVENTION

The disclosure provides a pressure sensor module with an anchor arrangement wherein the accuracy of pressure sensing is increased. The disclosure further provides a method for forming such a pressure sensor module with an anchor arrangement.

The pressure sensor module comprises a base electrode surrounding at least a part of a bottom electrode. Both electrodes contain an electrically conductive material. The pressure sensor module further comprises an anchor arrangement on top of the base electrode comprising at least two electrically conductive walls that both surround at least a part of the bottom electrode. The at least two electrically conductive walls of the anchor arrangement can, for example, be made of tungsten. The material of the electrically conductive walls can be deposited, for example, via chemical vapor deposition. The length of the electrically conductive walls can amount to more than 100 µm.

The pressure sensor module further comprises an electrically conductive layer that covers at least the bottom electrode and the anchor arrangement such that a cavity is formed between the bottom electrode, the anchor arrangement and the electrically conductive layer.

In the pressure sensor module the proportionate area of the electrically conductive walls in a cross section extending from the surface of the inner wall of the anchor arrangement facing the cavity to the surface of the outermost wall of the anchor arrangement facing away from the cavity in a plane parallel to the plane of the bottom electrode is equal to or less than 10%.

Another expression for the proportionate area of the electrically conductive walls is fraction of the material of the electrically conductive walls. The proportionate area can also relate to a ratio of the material of the electrically conductive walls in a given area or to a density where the density is not given in gram per cubic centimeters but in percent. This means, that the proportionate area of the electrically conductive walls within a cross section relates to the percentage of this material within a given area, for example a cross section.

The cross section through the anchor arrangement relates to an area in the anchor arrangement. This area is limited by the surface of the inner wall that directly faces the cavity and the surface of the outermost wall that is furthest away from the inner wall and which faces away from the cavity. The cross section relates to any area within the anchor arrangement in a plane parallel to the plane of the bottom electrode. The area of the cross section through the anchor arrangement is positioned on one side of the cavity, but not on different sides of the cavity.

The cross section through the anchor arrangement can also be defined along a line through the anchor arrangement. This line connects and includes the two walls delimiting the anchor arrangement, this means that the line connects the surface of the inner wall of the anchor arrangement facing the cavity and the surface of outermost wall of the anchor arrangement facing away from the cavity.

The cross section through the anchor arrangement can also be defined as a volume within the anchor arrangement. If the anchor arrangement is, for example, rectangular, a cube within the anchor arrangement can be defined where one side of the cube is given by a line that connects the surface of the inner wall facing the cavity and the surface of the outermost wall facing away from the cavity and which is perpendicular to these surfaces. Another side of the cube is given in a plane parallel to the plane of the bottom electrode and perpendicular to the first side of the cube. The third side of the cube is perpendicular to the first and the second side of the cube. If the cross section through the anchor arrangement is defined as a volume, the proportionate volume of the electrically conductive walls within this cross section is equal to or less than 10%.

In comparison to the case described above where the proportionate area of the electrically conductive walls in a cross section to the anchor arrangement amounts to more than 30%, the proportionate area can be reduced by either reducing the number of the trenches or by increasing the extent of the anchor arrangement. It is also possible to reduce the width of the trenches below 0.8 μm or to employ a combination of these examples.

In one embodiment the cavity is etched with vaporized hydrofluoric acid (HF).

In one embodiment an adhesive layer is deposited before the deposition of the electrically conductive layer. The adhesive layer can improve the adhesion to the underlying layer and can create a good Ohmic contact to the electrically conductive walls.

In one embodiment another adhesive layer is deposited on top of the electrically conductive layer. In one embodiment an adhesive layer is deposited below and another one on top of the electrically conductive layer.

With the proportionate area of the electrically conductive walls within a cross section through the anchor arrangement being equal to or less than 10% the erosion during a CMP step is reduced. Consequently, the height of the structure can be estimated more precisely such that the sensitivity calculation is improved and also the accuracy of the pressure sensor module is improved. Furthermore, the stress on the anchor arrangement is reduced because of the more uniform height and therefore the pressure sensor module is more robust. Also the process variability is reduced which leads to a better yield per wafer and lower costs.

In one embodiment the electrically conductive layer forms a suspended membrane.

In one embodiment the electrically conductive walls of the anchor arrangement are in electrical and mechanical contact with the base electrode. This means that the electrically conductive walls are directly positioned on top of the base electrode.

In one embodiment the proportionate area of the electrically conductive walls in the cross section has approximately the same value in all planes that are parallel to the bottom electrode and positioned between the electrically conductive layer and the base electrode. In other words, the percentage of the material of the electrically conductive walls within the cross section of the anchor arrangement is homogenous over the distance between the base electrode and the electrically conductive layer.

In one embodiment the pressure sensor module is positioned on top of an integrated circuit. The integrated circuit can be, for example, a complementary metal oxide semiconductor device. With this, the extent of the device can be reduced because the pressure sensor module is positioned on top of the integrated circuit and not next to it.

In one embodiment the proportionate area of the electrically conductive walls in the anchor arrangement along a cross section is at least 0.5%.

In one embodiment the anchor arrangement has a rectangular shape. In this case the cross section can be defined as a squared area where one side of the square is a line extending from the surface of the inner wall of the anchor arrangement facing the cavity to the surface of the outermost wall of the anchor arrangement facing away from the cavity. Furthermore, this line is perpendicular to the surfaces of the walls. The other side of the square is perpendicular to the first side of the square and lies in a plane that is parallel to the plane of the bottom electrode.

In other embodiments the shape of the anchor arrangement can be arbitrary.

In one embodiment the anchor arrangement further comprises electrically conductive vias between the at least two electrically conductive walls of the anchor arrangement. The vias are circular and they are connected to the base electrode and to the electrically conductive layer. In this embodiment the proportionate area of the electrically conductive walls and the electrically conductive vias in the total cross section extending from the surface of the inner wall of the anchor arrangement facing the cavity to the surface of the outermost wall of the anchor arrangement facing away from the cavity in a plane parallel to the plane of the bottom electrode is between 0.5% and 10%. In other words, the total cross section of the anchor arrangement is given by the total area between and including the two walls delimiting the anchor arrangement in a plane that is parallel to the plane of the bottom electrode.

In one embodiment the anchor arrangement further comprises electrically conductive structures between the at least two electrically conductive walls of the anchor arrangement. The electrically conductive structures between the electrically conductive walls can be of arbitrary shape and they are connected to the base electrode and the electrically conductive layer. In this embodiment the proportionate area of the electrically conductive walls and the electrically conductive structures in the total cross section extending from the surface of the inner wall of the anchor arrangement facing the cavity to the surface of the outermost wall of the anchor arrangement facing way from the cavity in a plane parallel to the plane of the bottom electrode is between 0.5% and 10%. The shape of the electrically conductive structures can be, for example, ring-like, rectangular or cross-shaped. Also in this embodiment the total cross section of the anchor arrangement refers to the total area between and including the two electrically conductive walls delimiting the anchor arrangement in a plane that is parallel to the plane of the bottom electrode.

In one embodiment the top of the electrically conductive walls of the anchor arrangement facing the electrically conductive layer is topographically flat due to chemical mechanical polishing (CMP). In order to create the walls of the anchor arrangement the electrically conductive material of the walls is deposited within trenches in a sacrificial layer and on top of the sacrificial layer. Uneven topography on top of the sacrificial layer is removed by CMP in order to enable the deposition of the electrically conductive layer onto a flat surface. With the proportionate area of the electrically conductive walls in a cross section through the anchor arrangement being equal to or less than 10%, erosion during the CMP step is reduced in such a way that the walls of the anchor arrangement are of the same height. In other words, after the CMP step the surface of the sacrificial layer and the anchor arrangement is approximately topographically flat.

In one embodiment an isolation layer is formed on top of the bottom electrode and below the cavity.

The method for forming a pressure sensor module comprises forming at least two trenches surrounding at least a part of an area by patterning of a sacrificial layer. The method further comprises depositing an electrically conductive material on top of the sacrificial layer and in the trenches such that an anchor arrangement comprising at least two electrically conductive walls is formed. The method further comprises removing a portion of the electrically conductive material and depositing an electrically conductive layer covering at least the anchor arrangement and the sacrificial layer. The method further comprises removing the sacrificial layer through at least one etch opening in the electrically conductive layer such that a cavity is formed below the electrically conductive layer and wherein the proportionate area of the electrically conductive walls in a cross section extending from the surface of the inner wall of the anchor arrangement facing the cavity to the surface of the outermost wall of the anchor arrangement facing away from the cavity in a plane parallel to the plane of the electrically conductive layer is between 0.5% and 10%. The material of the electrically conductive walls resists at least one etching agent. This means, for example, vaporized hydrofluoric acid does not attack the electrically conductive walls during etching of the cavity.

With the proportionate area of the electrically conductive walls within a cross section through the anchor arrangement being equal to or less than 10% the erosion during a CMP step is reduced. Consequently, the height of the structure can be estimated more precisely such that the sensitivity calculation is improved and also the accuracy of the pressure sensor module is improved. Furthermore, the stress on the anchor arrangement is reduced because of the more uniform height and therefore the pressure sensor module is more robust. Also the process variability is reduced which leads to a better yield per wafer and lower costs.

In one embodiment the method further comprises the deposition of a dielectric sealing layer on top of the electrically conductive layer such that the cavity is sealed.

In one embodiment of the method the electrically conductive layer forms a suspended membrane.

In one embodiment of the method the pressure sensor module is positioned on top of an integrated circuit.

In one embodiment of the method a portion of the electrically conductive material is removed by CMP. This means, after the deposition of the electrically conductive material of the walls of the anchor arrangement a portion of this material on top of the sacrificial layer is removed by CMP. The material of the electrically conductive walls can be, for example, tungsten. In this case erosion induced by the CMP step is reduced for the given range of the proportionate area of the electrically conductive walls in a cross section of the anchor arrangement in such a way that the walls of the anchor arrangement are approximately of the same height and that the surface of the sacrificial layer and the anchor arrangement is approximately topographically flat.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

FIG. 3A shows a height profile for two different devices;

FIG. 3B shows a cutaway view of a device with a closed top electrode;

FIG. 3C shows a cutaway view of a device with a suspended membrane;

FIG. 3D shows a cutaway view of an exemplary embodiment of an anchor arrangement;

FIGS. 4A and 4B show a top view on a section of an anchor arrangement;

FIGS. 8A to 8E show top views of exemplary embodiments of electrically conductive structures within the anchor arrangement;

DETAILED DESCRIPTION

Figure 1:
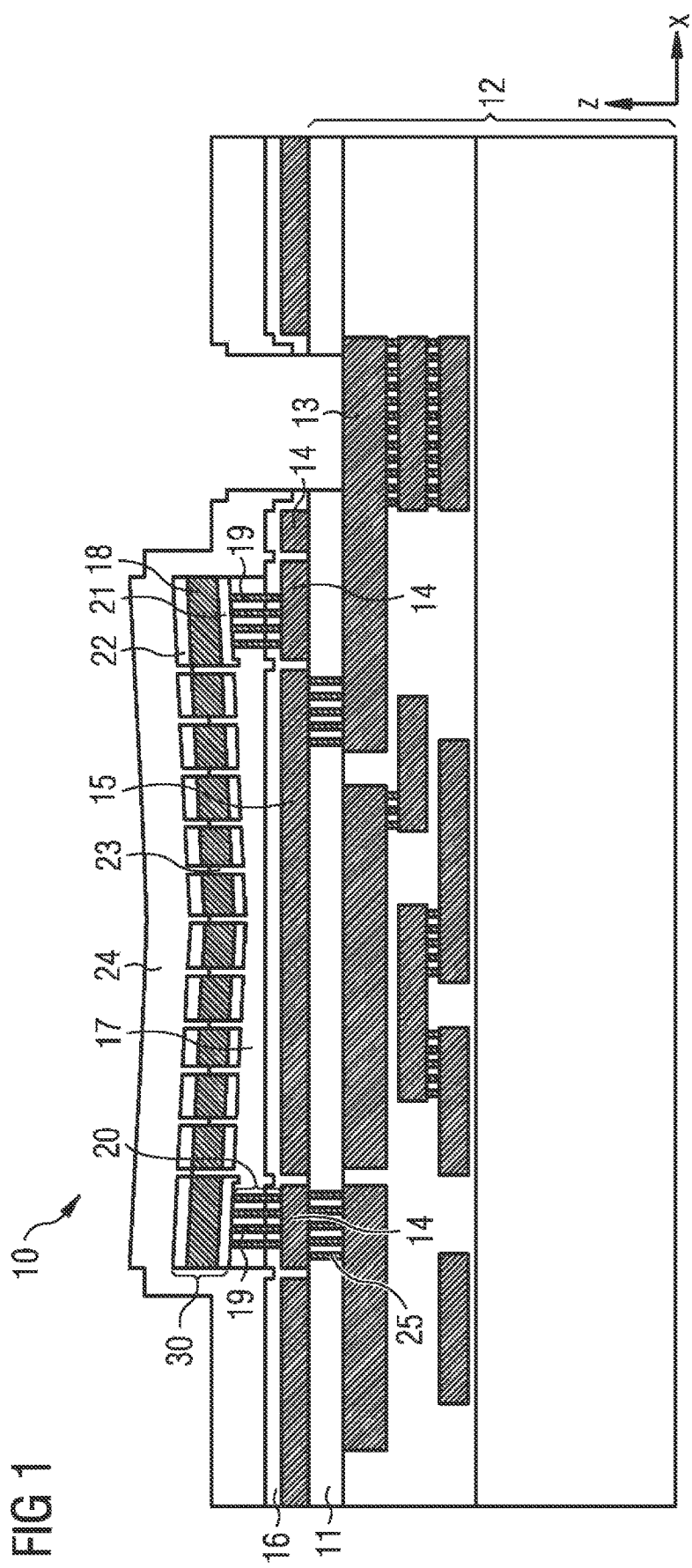
FIG. 1 shows a cutaway view of an exemplary embodiment of the pressure sensor module.

FIG. 1 shows a cutaway view of an exemplary embodiment of a pressure sensor module 10 on top of a passivation layer 11 of an integrated circuit 12. The integrated circuit 12 can be, for example, a complementary metal oxide semiconductor device. The semiconductor device may include a contact pad 13. On top of the passivation layer 11 there is a base electrode 14 that surrounds at least a part of a bottom electrode 15. The base electrode 14 and the bottom electrode 15 are electrically isolated from each other by a etch stop layer 16 on top and in between the base electrode 14 and the bottom electrode 15. Above the etch stop layer 16 a cavity 17 is formed below an electrically conductive layer 18 and bordered by an anchor arrangement 20. The anchor arrangement 20 comprises at least two electrically conductive walls 19 which are connected to the base electrode 14 and the electrically conductive layer 18 and which surround at least a part of the bottom electrode 15. Below the electrically conductive layer 18 there may be an adhesion layer 21 and there may be another adhesion layer 22 on top of the electrically conductive layer 18. The electrically conductive layer 18 and the adhesion layers 21 and 22 comprise several etch openings 23. On top of the electrically conductive layer 18 and the adhesion layers 21, 22 there is a sealing layer 24 that laterally extends also over other parts of the device. Vias 25 connect the pressure sensor module 10 to an electrically conductive layer 18 of the integrated circuit 12. Cutaway views of the semiconductor device or the pressure sensor module 10 are given along the x or y axis and top views are given along the z axis.

With the pressure sensor module 10 being positioned on top of the integrated circuit 12 and not next to it the extent of the device can be reduced such that the device requires less area on the chip.

Figure 2:
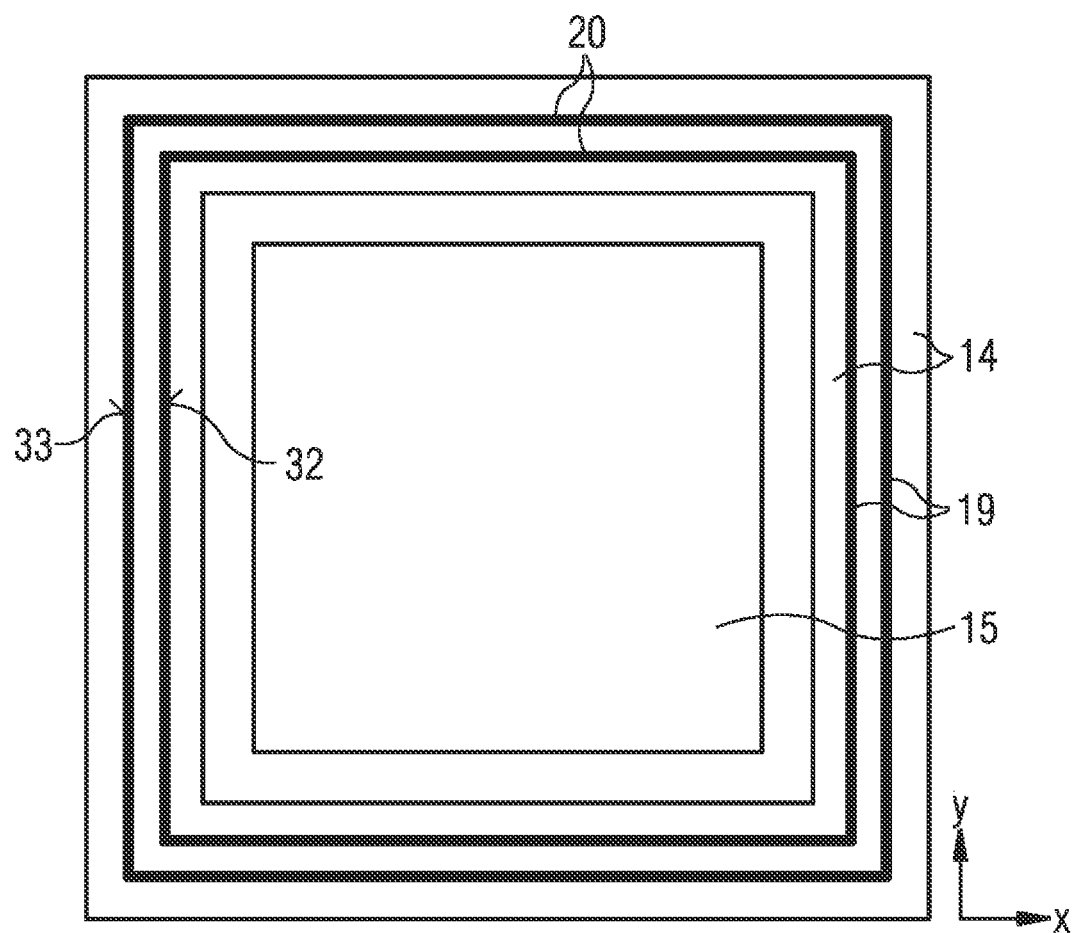
FIG. 2 shows a top view of an exemplary embodiment of the anchor arrangement on top of the base electrode.

FIG. 2 shows a top view of an exemplary embodiment of the anchor arrangement 20. The at least two electrically conductive walls 19 are arranged on top of the base electrode 14 and surround the bottom electrode 15. The surface 32 of the inner wall of the anchor arrangement 20 faces the cavity 17 and the surface 33 of the outermost wall of the anchor arrangement 20 faces away from the cavity 17.

FIG. 3A shows two height profiles along the x axis for two different devices. Profile 26 is the height profile for a device where a sacrificial layer 27 is positioned below the electrically conductive layer 18. The height profile is recorded on top of the anchor arrangement 20 and the sacrificial layer 27 in a lateral direction x. At the position of the anchor arrangement 20, the height is reduced in comparison to the sacrificial layer 27. This difference in height is referred to as the step height 28. The profile 29 is a height profile along a pressure sensor module 10 in lateral direction x. This means that the cavity 17 is between the anchor arrangement 20, the bottom electrode 15 and the electrically conductive layer 18. The height profile shows that the electrically conductive walls 19 and the anchor arrangement 20 are not of the same height. This means that also in this case a step height 28 is recorded. The recorded step height can be 30 to 80 nm.

FIG. 3B shows a cutaway view of a part of a device with a sacrificial layer 27 between the bottom electrode 15 and the electrically conductive layer 18. Profile 26 is recorded for a device as depicted in FIG. 3B.

FIG. 3C shows a cutaway view of a part of a device with a suspended membrane 30. Between the suspended membrane 30, the bottom electrode 15 and the anchor arrangement 20 there is a cavity 17. Profile 29 is recorded for a device as shown in FIG. 3C.

FIG. 3D shows a cutaway view of an exemplary embodiment of an anchor arrangement 20. A sacrificial layer 27 is positioned on top of the base electrode 14 and the bottom electrode 15 and the electrically conductive walls 19 of the anchor arrangement 20 are positioned on top of the base electrode 14. The electrically conductive walls 19 may not all be of the same height due to erosion induced by the CMP process. Therefore, the actual height of the anchor arrangement 20 is reduced in comparison to the thickness of the sacrificial layer 27. The arrow below the walls 19 of the anchor arrangement 20 illustrates the extent of the cross section through the anchor arrangement 20.

FIG. 4A shows a top view of a section of an exemplary embodiment of an anchor arrangement 20 which has a rectangular shape. The anchor arrangement 20 comprises several electrically conductive walls 19 that are parallel to each other.

FIG. 4B shows a top view of a section of an exemplary embodiment of the anchor arrangement 20 in which the electrically conductive walls 19 are parallel to each other. A squared area 31 can be defined as a cross-section through the anchor arrangement 20 in the x-y plane.

Figure 5B:
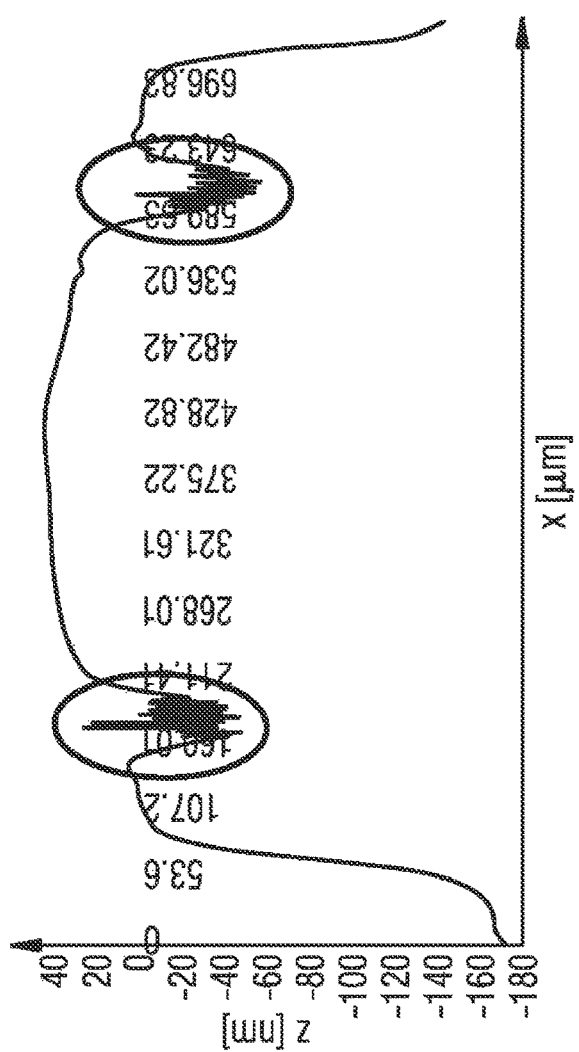
FIG. 5B shows a height profile along the anchor arrangement shown in FIG. 5A.
Figure 5A:
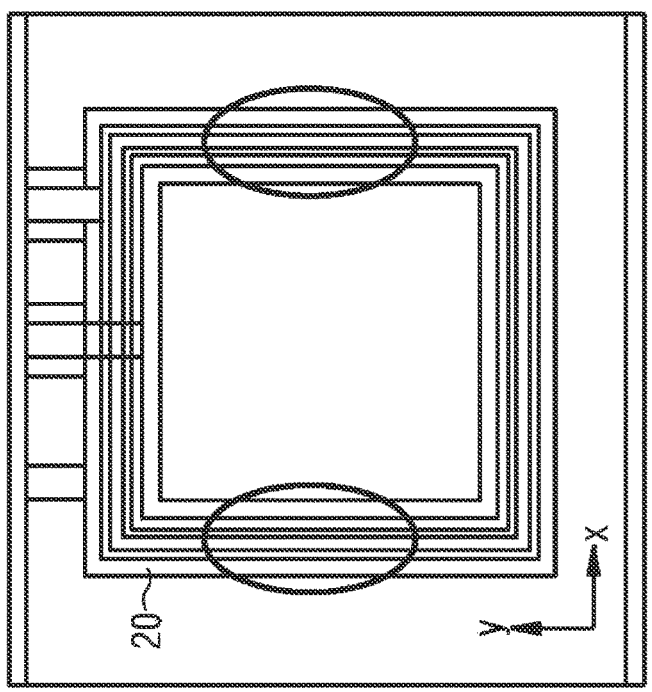
FIG. 5A shows a top view of an exemplary embodiment of a square-shaped anchor arrangement.

FIG. 5A shows a top view of an exemplary embodiment of the anchor arrangement 20 that has the shape of a square. The electrically conductive walls 19 are parallel to each other.

FIG. 5B shows a height profile along the anchor arrangement 20 depicted in FIG. 5A along the x axis. The two encircled areas correspond to two parts of the anchor arrangement 20. In this embodiment the high percentage of the proportionate area of the electrically conductive walls 19 in a cross section through the anchor arrangement 20 leads to a reduction in height within the anchor arrangement 20 in comparison to the height of the sacrificial layer 27.

Figure 6B:
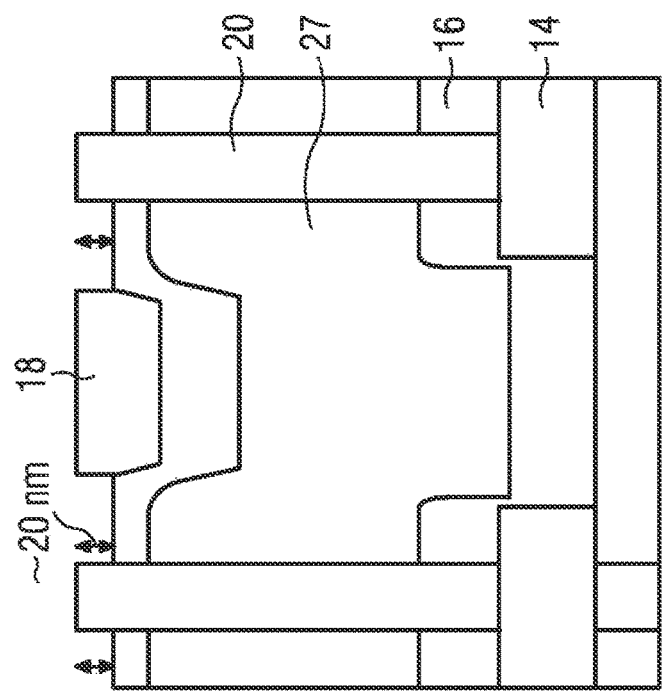
FIG. 6B shows a cutaway view of a part of an exemplary embodiment of a pressure sensor module.
Figure 6A:
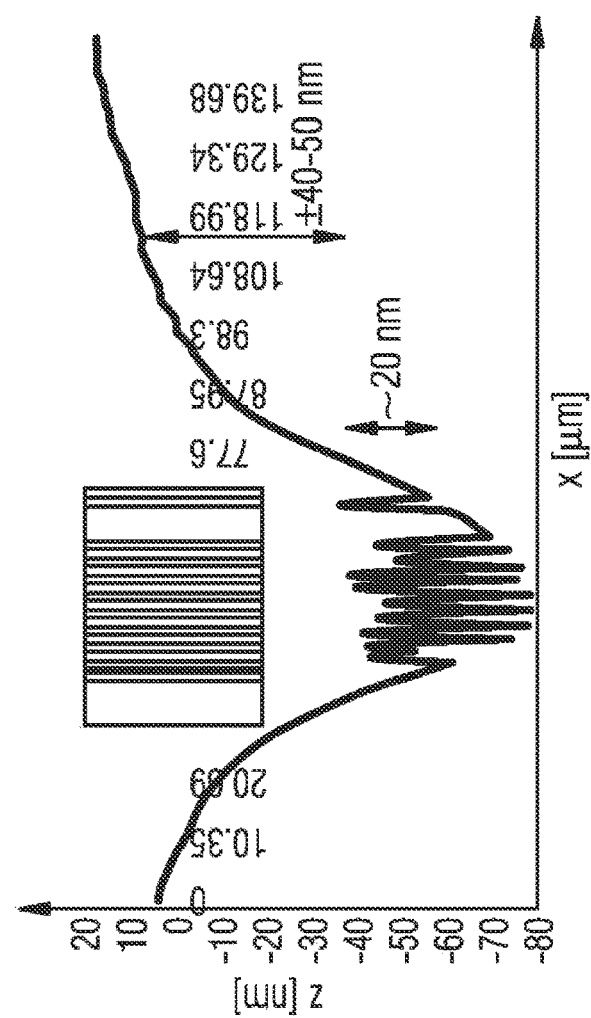
FIG. 6A shows a zoom-in of the height profile in FIG. 5B.

FIG. 6A shows a height profile which is a zoom-in of the height profile depicted in FIG. 5B. The smaller picture shows a top view on the electrically conductive walls 19 of the anchor arrangement 20 at the respective position in the height profile. The height profile shows again the reduction in height in the region of the anchor arrangement 20.

FIG. 6B shows a schematic cutaway view of the anchor arrangement 20, the sacrificial layer 27 and a part of the electrically conductive layer 18. The electrically conductive wall 19 can be about 20 nm higher than the rest of the sacrificial layer 27 due to oxide loss during the CMP step.

Figure 7A:
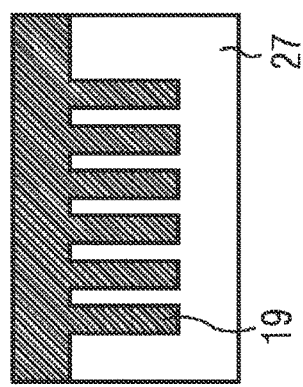
FIGS. 7A, 7B and 7C show cutaway views of different embodiments of the anchor arrangement.

FIG. 7A shows a schematic cutaway view of a part of the anchor arrangement 20 without the base electrode 14. The electrically conductive material of the electrically conductive walls 19 in the anchor arrangement 20 is also deposited on top of the sacrificial layer 27.

Figure 7B:
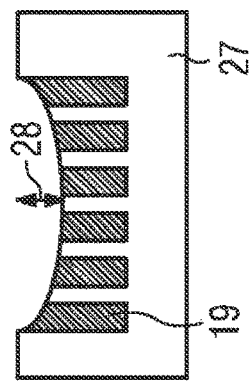

FIG. 7B shows the same structure as in FIG. 7A after the CMP step. Due to the high fraction of the material of the electrically conductive walls 19 within a cross section through the anchor arrangement 20, erosion takes place on top of the anchor arrangement 20 during the CMP step. Therefore, the electrically conductive walls 19 are not of the same height and the height of the electrically conductive walls 19 in the center of the anchor arrangement 20 is significantly reduced in comparison to the height of the surrounding sacrificial layer 27.

Figure 7C:
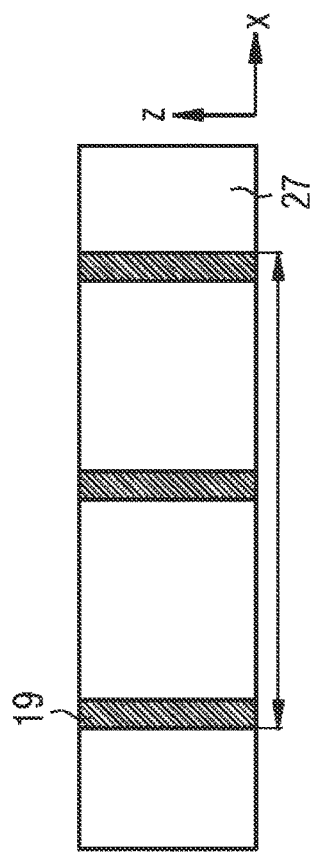

FIG. 7C shows a schematic cutaway view of an anchor arrangement 20 where the fraction of the material of the electrically conductive walls 19 within a cross section through the anchor arrangement 20 is reduced in comparison to the case depicted in FIG. 7B. With this reduced fraction of material of the electrically conductive walls 19 within the anchor arrangement 20, the erosion during the CMP step is also reduced and the height of the electrically conductive walls 19 is approximately the same as of the remaining sacrificial layer 27. The arrow below the walls 19 of the anchor arrangement 20 illustrates the extent of the cross section through the anchor arrangement 20.

FIG. 8A shows a top view on a part of the anchor arrangement 20. In this exemplary embodiment circular vias 34 are positioned between the electrically conductive walls 19 of the anchor arrangement 20.

FIG. 8B shows a top view on a part of the anchor arrangement 20. In this exemplary embodiment further electrically conductive structures 35 are positioned between the electrically conductive walls 19 of the anchor arrangement 20. In an exemplary embodiment these further electrically conductive structures 35 can be ring-shaped.

FIG. 8C shows a top view on a part of the anchor arrangement 20. In this exemplary embodiment the electrically conductive structures 35 form the outer edge of a square.

FIG. 8D shows a top view on a part of the anchor arrangement 20. In this exemplary embodiment the electrically conductive structures 35 form the outer edge of a rectangle.

FIG. 8E shows a top view on a part of the anchor arrangement 20. In this exemplary embodiment the electrically conductive structures 35 form a cross between the electrically conductive walls 19.

Figure 9A:
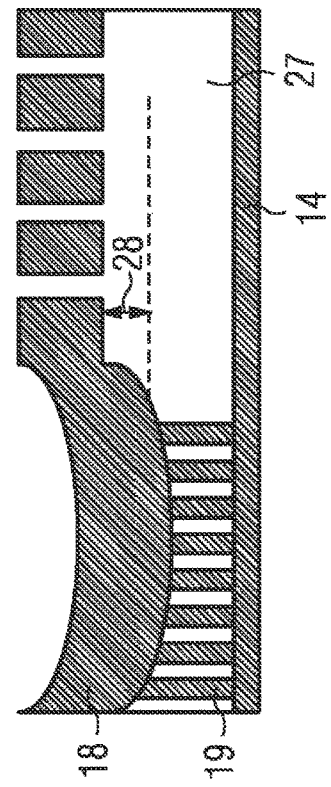
FIG. 9A shows a cutaway view of a part of an exemplary embodiment of an anchor arrangement.

FIG. 9A shows a cutaway view of the anchor arrangement 20 and a part of the sacrificial layer 27. The fraction of the material of the electrically conductive walls 19 within a cross section through the anchor arrangement 20 is so high that the CMP step incudes erosion in the region of the anchor arrangement 20. Therefore, the height of the electrically conductive layer 18 on top of the anchor arrangement 20 and the sacrificial layer 27 is reduced in the region of the anchor arrangement 20 in comparison to the adjacent cavity 17.

Figure 9B:
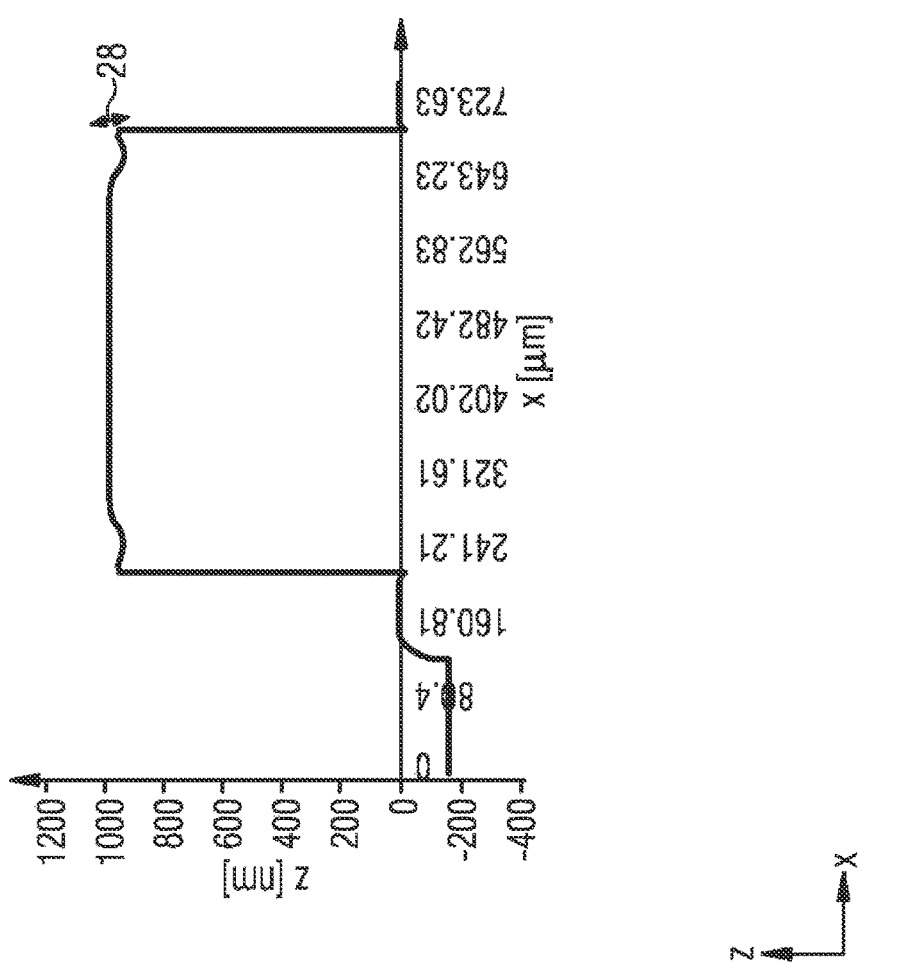
FIG. 9B shows a height profile along the embodiment shown in FIG. 9A.

FIG. 9B shows a height profile along the structure depicted in FIG. 9A.

Figure 9C:
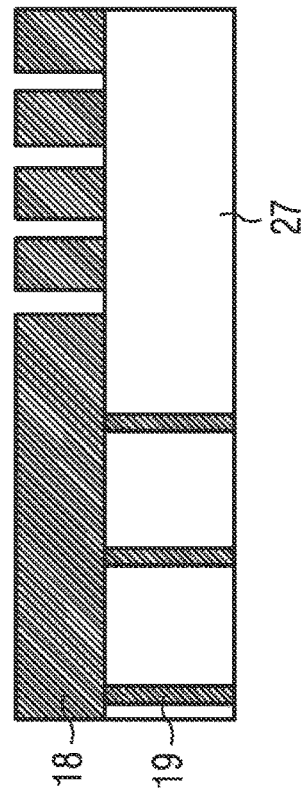
FIG. 9C shows a cutaway view of another exemplary embodiment of an anchor arrangement.

FIG. 9C shows a cutaway view of the anchor arrangement 20 with a part of the sacrificial layer 27 where the fraction of the material of the electrically conductive walls 19 in a cross section through the anchor arrangement 20 is reduced in comparison to the case depicted in FIG. 9A. Therefore, the CMP step does not induce erosion in the area of the anchor arrangement 20 and thus the electrically conductive walls 19 all exhibit approximately the same height and there is no difference in height in the electrically conductive layer 18.

The invention claimed is:
1. A pressure sensor module comprising:
a base electrode surrounding at least a part of a bottom electrode;

an anchor arrangement on top of the base electrode comprising at least two electrically conductive walls that both surround at least the part of the bottom electrode; and an electrically conductive layer that covers at least the bottom electrode and the anchor arrangement such that a cavity is formed between the bottom electrode, the anchor arrangement and the electrically conductive layer, wherein, on at least one side of the cavity, a proportionate area of the electrically conductive walls in a cross section extending from a surface of an inner wall of the anchor arrangement facing the cavity to a surface of an outermost wall of the anchor arrangement facing away from the cavity in a plane parallel to a plane of the bottom electrode is equal to or less than 10% of an area of the anchor arrangement.

2. The pressure sensor module according to claim 1, wherein the electrically conductive layer forms a suspended membrane.

3. The pressure sensor module according to claim 1, wherein the electrically conductive walls of the anchor arrangement are in electrical and mechanical contact with the base electrode.

4. The pressure sensor module according to claim 1, wherein the proportionate area of the electrically conductive walls in the cross section has approximately the same value in all planes that are parallel to the bottom electrode and positioned between the electrically conductive layer and the base electrode.

5. The pressure sensor module according to claim 1, wherein the pressure sensor module is positioned on top of an integrated circuit.

6. The pressure sensor module according to claim 1, wherein the proportionate area of the electrically conductive walls in the anchor arrangement within the cross section is at least 0.5%.

7. The pressure sensor module according to claim 1, wherein the anchor arrangement has a rectangular shape.

8. The pressure sensor module according to claim 1, wherein the anchor arrangement further comprises electrically conductive vias between the at least two electrically conductive walls of the anchor arrangement which are also connected to the base electrode and to the electrically conductive layer, and wherein the proportionate area of the electrically conductive walls and vias in a total cross section extending from the surface of the inner wall of the anchor arrangement facing the cavity to the surface of the outermost wall of the anchor arrangement facing away from the cavity in a plane parallel to the plane of the bottom electrode is between 0.5% and 10%.

9. The pressure sensor module according to claim 1, wherein the anchor arrangement further comprises electrically conductive structures between the at least two electrically conductive walls of the anchor arrangement which are also connected to the base electrode and the electrically conductive layer, and wherein the proportionate area of the electrically conductive walls and structures in a total cross section extending from the surface of the inner wall of the anchor arrangement facing the cavity to the surface of the outermost wall of the anchor arrangement facing away from the cavity in a plane parallel to the plane of the bottom electrode is between 0.5% and 10%.

10. The pressure sensor module according to claim 1, wherein a top of the electrically conductive walls of the anchor arrangement facing the electrically conductive layer is topographically flat due to chemical mechanical polishing.

11. The pressure sensor module according to claim 1, wherein an isolation layer is formed on top of the bottom electrode and below the cavity.

12. A method for forming a pressure sensor module, the method comprising:

forming at least two trenches surrounding at least a part of an area by patterning of a sacrificial layer;

depositing an electrically conductive material on top of the sacrificial layer and in the trenches such that an anchor arrangement comprising at least two electrically conductive walls is formed;

removing a portion of the electrically conductive material;

depositing an electrically conductive layer covering at least the anchor arrangement and the sacrificial layer; and removing the sacrificial layer through at least one etch opening in the electrically conductive layer such that a cavity is formed below the electrically conductive layer, wherein, on at least one side of the cavity, a proportionate area of the electrically conductive walls in a cross section extending from a surface of an inner wall of the anchor arrangement facing the cavity to a surface of an outermost wall of the anchor arrangement facing away from the cavity in a plane parallel to a plane of the electrically conductive layer is between 0.5% and 10% of an area of the anchor arrangement.

13. The method for forming the pressure sensor module according to claim 12, wherein the electrically conductive layer forms a suspended membrane.

14. The method for forming the pressure sensor module according to claim 12, wherein the pressure sensor module is positioned on top of an integrated circuit.

15. The method for forming the pressure sensor module according to claim 12, wherein the portion of the electrically conductive material is removed by chemical mechanical polishing.

16. The method for forming the pressure sensor module according to claim 12, wherein the anchor arrangement has a rectangular shape.

17. The method for forming the pressure sensor module according to claim 12, further comprising providing a bottom electrode below the cavity.

18. The method for forming the pressure sensor module according to claim 17, further comprising forming an isolation layer on top of the bottom electrode and below the cavity.

* * * * *